United States Patent [19]
Dreibelbis et al.

[11] Patent Number: 5,173,906
[45] Date of Patent: Dec. 22, 1992

[54] BUILT-IN SELF TEST FOR INTEGRATED CIRCUITS

[76] Inventors: Jeffrey H. Dreibelbis, 39 Beartown La., Williston, Vt. 05495; Erik L. Hedberg, 20 Lang Dr., Essex Junction, Vt. 05452; John G. Petrovick, Jr., 10 Partridge Hill, Colchester, Vt. 05446

[21] Appl. No.: 576,646

[22] Filed: Aug. 31, 1990

[51] Int. Cl.⁵ .............................................. G06F 11/00
[52] U.S. Cl. ................................... 371/22.5; 371/25.1
[58] Field of Search ............... 371/22.5, 22.6, 25.1, 371/27

[56] References Cited

U.S. PATENT DOCUMENTS

| | | | |
|---|---|---|---|
| 4,635,261 | 1/1987 | Anderson et al. | 371/22.5 |
| 4,931,722 | 6/1990 | Stoica | 371/22.5 |
| 5,006,787 | 4/1991 | Katircioglu et al. | 371/22.5 |
| 5,051,997 | 9/1991 | Sakashita et al. | 371/22.5 |
| 5,103,167 | 4/1992 | Okano et al. | 371/22.5 |

FOREIGN PATENT DOCUMENTS

| | | |
|---|---|---|
| 0263312 | 4/1988 | European Pat. Off. . |
| 0350538 | 1/1990 | European Pat. Off. . |
| 8902122 | 8/1987 | PCT Int'l Appl. . |
| 2191008A | 5/1986 | United Kingdom . |

*Primary Examiner*—Vincent P. Canney
*Attorney, Agent, or Firm*—J. Dennis Moore

[57] ABSTRACT

A built-in, i.e., on-chip, self-test system for a VLSI logic or memory module. A deterministic data pattern generator is provided on the VLSI chip, and operates to test a chip module and provide a fail/no-fail result, along with data identifying where the fail occurred. This location data is captured and made available for subsequent utilization. The built-in test circuitry is programmable, and is provided with a looping capability to provide enhanced burn-in testing, for example.

16 Claims, 14 Drawing Sheets

| Pattern | Type | | Order |
|---|---|---|---|
| PROG. (RW or RB) | 1) Write 0 | | Ascending |
| | 2) Read or write, "0" or "1" (R/W,0/1); R/W, 0/1; R/W, 0/1; R/W, 0/1 | | Ascending |
| | 3) Repeat 2) with true or complement data selected | | Ascending |
| | 4) Write 1 | | Ascending |
| | 5) Repeat 2) with complement of 2) data | | Ascending |
| | 6) Repeat 3) with complement of 3) data | | Ascending |
| | 7) Write 0 | | Descending |
| | 8) Repeat 2) | | Descending |
| | 9) Repeat 3) | | Descending |
| | 10) Write 1 | | Descending |
| | 11) Repeat 5) | | Descending |
| | 12) Repeat 6) | | Descending |
| UARW | 1) Write 0 | | Ascending |
| | 2) Read 0/Write 1/Read 1 | | Ascending |
| | 3) Read 1/Write 0/Read 0 | | Ascending |
| | 4) Write 1 | | Ascending |
| | 5) Read 1/Write 0/Read 0 | | Ascending |
| | 6) Read 0/Write 1/Read 1 | | Ascending |
| | 7) Write 0 | | Descending |
| | 8) Read 0/Write 1/Read 1 | | Descending |
| | 9) Read 1/Write 0/Read 0 | | Descending |
| | 10) Write 1 | | Descending |
| | 11) Read 1/Write 0/Read 0 | | Descending |
| | 12) Read 0/Write 1/Read 1 | | Descending |

Fig. 2A.

| | | |
|---|---|---|
| UARB | 1) Write 0 | Ascending |
| | 2) Read 0/Write 1/Read 1 | Ascending |
| | 3) Read 1/Write 0/Read 0 | Ascending |
| | 4) Write 1 | Ascending |
| | 5) Read 1/Write 0/Read 0 | Ascending |
| | 6) Read 0/Write 1/Read 1 | Ascending |
| | 7) Write 0 | Descending |
| | 8) Read 0/Write 1/Read 1 | Descending |
| | 9) Read 1/Write 0/Read 0 | Descending |
| | 10) Write 1 | Descending |
| | 11) Read 1/Write 0/Read 0 | Descending |
| | 12) Read 0/Write 1/Read 1 | Descending |
| WLS (RW) | 1) Write 0/1 Stripe With Alternate Data Bits | Ascending |
| | 2) Read 0/1 Stripe With Alternate Data Bits | Ascending |
| | 3) Write 0/1 Stripe With Alternate Data Bits | Ascending |
| | 4) Read 0/1 Stripe With Alternate Data Bits | Ascending |
| | 5) Write 0/1 Stripe With Alternate Data Bits | Descending |
| | 6) Read 0/1 Stripe With Alternate Data Bits | Descending |
| | 7) Write 0/1 Stripe With Alternate Data Bits | Descending |
| | 8) Read 0/1 Stripe With Alternate Data Bits | Descending |
| CH (RB) | 1) Write Checkerboard | Ascending |
| | 2) Read Checkerboard | Ascending |
| | 3) Write Inv. Checkerboard | Ascending |
| | 4) Read Inv. Checkerboard | Ascending |
| BL (RB) | 1) Write Checkerboard (Bit Write open) | Ascending |
| | 2) Read Checkerboard | Ascending |
| | 3) Write Inv. Checkerboard (Bit Write closed) | Ascending |
| | 4) Read Checkerboard | Ascending |

Fig. 2B.

| SRL 302 | SRL 304 | SRL 306 | PATTERN / NOP |
|---|---|---|---|
| 0 | 0 | 0 | PRG (342) |
| 0 | 0 | 1 | UAKW (344) |
| 0 | 1 | 0 | UARB (346) |
| 0 | 1 | 1 | WL5 (348) |
| 1 | 0 | 0 | (NOT USED) |
| 1 | 0 | 1 | CH (350) |
| 1 | 1 | 0 | BL (352) |
| 1 | 1 | 1 | NOP (354) |

Fig. 5.

| 414 | 418 | STATE |
|---|---|---|
| 0 | 0 | TRUE DATA, ASCENDING ADD |
| 0 | 1 | COMP DATA, ASCENDING ADD |
| 1 | 0 | TRUE DATA, DESCENDING ADD |
| 1 | 1 | COMP DATA, DESCENDING ADD |

| 504 | 502 | 506 | STATE |
|---|---|---|---|
| 0 | 0 | 0 | WRITE BACKGROUND DATA (510) |
| 1 | 0 | 0 | SEQUENCE RWRT (512) |
| 0 | 1 | 0 | SEQUENCE RWRC (514) |
| 1 | 1 | 0 | SEQUENCE RWPT (516) |
| 1 | 1 | 1 | SEQUENCE RWPC/T (518) |

| 634 | 640 | STATE |
|---|---|---|
| 0 | 0 | READ PHASE A |
| 0 | 1 | WRITE PHASE A |
| 1 | 0 | READ PHASE B |
| 1 | 1 | WAIT |

BUILT-IN SELF TEST FOR INTEGRATED CIRCUITS

BACKGROUND OF THE INVENTION

1. Field of the Invention

The present invention relates to testing of integrated circuits and more particularly relates to built-in self test arrangements that are provided on the integrated circuit chip itself.

2. Background Art

As the integrated circuit art has advanced, more and more circuit devices, and consequently more and more circuit function, have been placed on single chips. These developments have posed problems with regard to the testing of such circuits. For example, while the testing of even an extremely large memory array chip may be relatively straight forward, a chip that integrates various different kinds of functions, including an embedded memory array and logic, may pose problems for the circuit designer/tester who desires adequate testability of the embedded memory array. For example, typically such embedded memory arrays have far fewer I/O pins available to the circuit tester than a memory array occupying a stand alone chip. The problems associated with testing of embedded memory arrays extend to embedded logic function as well.

A general solution to the above-described problems that have developed is to embed test circuitry on the chip itself. Such schemes are frequently referred to as Built-In Self Test ("BIST") or Array Self Test ("AST"). Hereinafter, such arrangements are referred to generically as BIST circuits. In the case of testing embedded memory circuits, such as Static Random Access Memory Circuits and Dynamic Random Access Memory Circuits, BIST circuits have heretofore been limited to the provision of deterministic patterns by way of memory arrays that take large amounts of chip area, which is undesirable.

For background, please refer to "A Realistic Self-Test Machine For Static Random Access Memories," by R. Dekker, F. Beenker, L. Thijssen, 1988 IEEE International Test Conference, pp. 353-361; "A 55 ns 16 Mb Dram," by T. Takeshima, et al., 1989 IEEE International Solid States Circuits Conference, Digest Of Technical Papers, pp. 246 et seq.; "RPST: A ROM based Pseudo-Exhaustive Self-Test Approach," by M. Ligthart, et al., 1987 IEEE International Test Conference, pp. 915 et seq., "An Efficient Built-In Self-Testing For Random Access Memory," by P. Mazumder and J. Patel, 1987 IEEE International Test Conference, pp. 1072 et seq.; and "A Novel Approach For Testing Memories Using A Built-In Self-Testing Technique," by K. Le and K. Saluja, 1986 IEEE International Test Conference, pp. 830 et seq.

Another characteristic of prior art BIST circuits is that such circuits typically default to a wait state after completing its pattern set. This operation has actually been considered to be desirable, as it preserves result data valid upon completion of the test.

U.S. Pat. No. 4,740,970, issued Apr. 26, 1988, discloses a built-in logic block observation ("BILBO") register design, whereby register elements are adapted to operate selectively in different operating modes in response to control signals from control means.

U.S. Pat. No. 4,788,684, issued Nov. 29, 1988, discloses a memory test apparatus comprising means for generating an algorithmic pattern to be provided as input to the memory under test. An auxilliary pattern generator is used for storing expected values of the memory under test, against which the memory output is compared.

U.S. Pat. No. 4,984,800, issued Jan. 16, 1990, discloses a reconfigurable register bit-slice for use in BILBO circuits. Front end logic is disclosed which switches a single circuit switch between a data input and an output of the front end logic. Thus, a single circuit switch of delay is added to normal operation of a standard shift register, modified to be reconfigurable.

U.S. Pat. No. 4,404,519, issued Sep. 13, 1983, discloses test circuitry for embedded arrays which is not directly accessible from primary input/output pins. This test circuitry, which is manufactured directly on chip, permits external testers to invoke a variety of array tests without redesigning the chip architecture.

U.S. Pat. No. 4,667,330, issued May 19, 1987, discloses a semiconductor memory chip with self-diagnostic means which functions to indicate a defective cell. The self-diagnostic circuitry is mounted on the same chip as that of the memory array and has means for storing information to be stored in the memory array, and means for comparing the content of said storing means with output information which is read out of the address at which the information is stored.

U.S. Pat. No. 4,635,261, issued Jan. 6, 1987, discloses an on-chip test system for arrays which allows both synchronous and pipeline modes of normal operation. Control logic is coupled between control signal inputs and shift registers for selecting the system's mode of operation. A comparatory circuit is coupled to output shift registers for comparing system output signals with expected signals.

U.S. Pat. No. 4,357,703, issued Nov. 2, 1982, discloses a test system for LSI circuits resident on each LSI chip under test. The test system provides test operands for the logic function under test and analyzes the resulting operands. Checksum logic together with a shift register produce a running checksum of all output states of the module under test at the operative clock rate of the LSI.

SUMMARY OF THE INVENTION

The present invention overcomes the above-described limitations of the prior art in BIST circuits. According to one aspect of the invention an on-chip self test arrangement for VLSI circuit is provided, including a data pattern generator on the same chip as the VLSI circuit for generating predetermined deterministic test data for application to the data inputs of the VLSI circuit. A control signal generator is also provided for generating control signals for operation of the VLSI circuit to enable its operation on the test data. A generator, which may be the same as the data pattern generator, is provided for generating data expected from the application of the test data to the VLSI circuit. Finally, the expected data is compared against the actual data, and a pass/fail signal is generated in response thereto. In this way, predetermined deterministic test patterns may be applied to an embedded macro circuit, for example, in a VLSI circuit. This deterministic test data is generated by way of a generator occupying far less space than a memory array, whereby prior art deterministric test patterns for built-in self test arrangements were provided.

According to a further aspect of the invention an on-chip self test arrangement for VLSI circuit is provided including the above described components and principals of operation, and in addition whereby the location wherein the VLSI circuit a failure occurred is stored for later utilization in, for example, failure analysis, or activation of duplicative logic or memory circuitry.

According to a still further aspect of the present invention, an on-chip self test arrangement for a VLSI circuit is provided including all of the aforementioned components and principals of operation, and further whereby the data pattern generator and control pattern generator are activated cyclically so as to apply the test data to the VLSI circuit repetitively.

Finally, according to a still further aspect of the present invention an on-chip self test arrangement for a VLSI circuit is provided with programmable pattern sequences wherein said data patterns are selectable by way of codes in an instruction applied thereto. This highly desirable programmability solves the problem that hereintofore circuit sensitivities to particular self test patterns had to be predicted, and particular test patterns built in prior to memory product fabrication, typically in large memory arrays. However predictions of circuit sensitivity to such patterns have been seldom accurate. The programmability provided by the present invention reduces, therefore, the probability of self-test redesign, and resultant expenditure of cost and time associated with test pattern mispredictions.

In addition, the present invention provides looping capability, that is, a method for invoking a continuous, repetitive (looping) operation on a chosen BIST pattern. As into a wait state after all tests for a given chip have been exercised. This provides the benefit that if arrays of various sizes are placed on a chip, each containing its own self-test structure, all can be tested in parallel, thus reducing test time. However, this wait feature disrupts normal characterization procedures, and limits in-situ burn-in of the product. Once BIST has entered a wait state, it cannot be reactivated without initialization via a scan in logic signature. Furthermore, during this reinitialization all fail information about the macro under test is typically corrupted. Thus, scan in operations and normal bist cycling must be perfectly coordinated so as not to lose critical fail information during in-situ burn-in. This procedure is both costly and time consuming. With the looping capability of the present invention, the original scan pattern is reinvoked and exercised. During looping, circuit fails are continuously recorded for in-situ burn-in. This looping on a pattern also provides important characterization feedback.

The invention will be described in greater detail by referring to the attached drawings and the description of the preferred embodiment which follows.

BRIEF DESCRIPTION OF THE DRAWINGS

FIG. 2 is a table showing in detail the sequences of reading and writing operations, including type of data and whether addressing in ascending or descending order, by which the preferred embodiment to the present invention operates.

FIG. 5 is a state table showing the logic operation of the circuit shown in FIG. 4.

DETAILED DESCRIPTION OF THE PREFERRED EMBODIMENT

Figure 1:
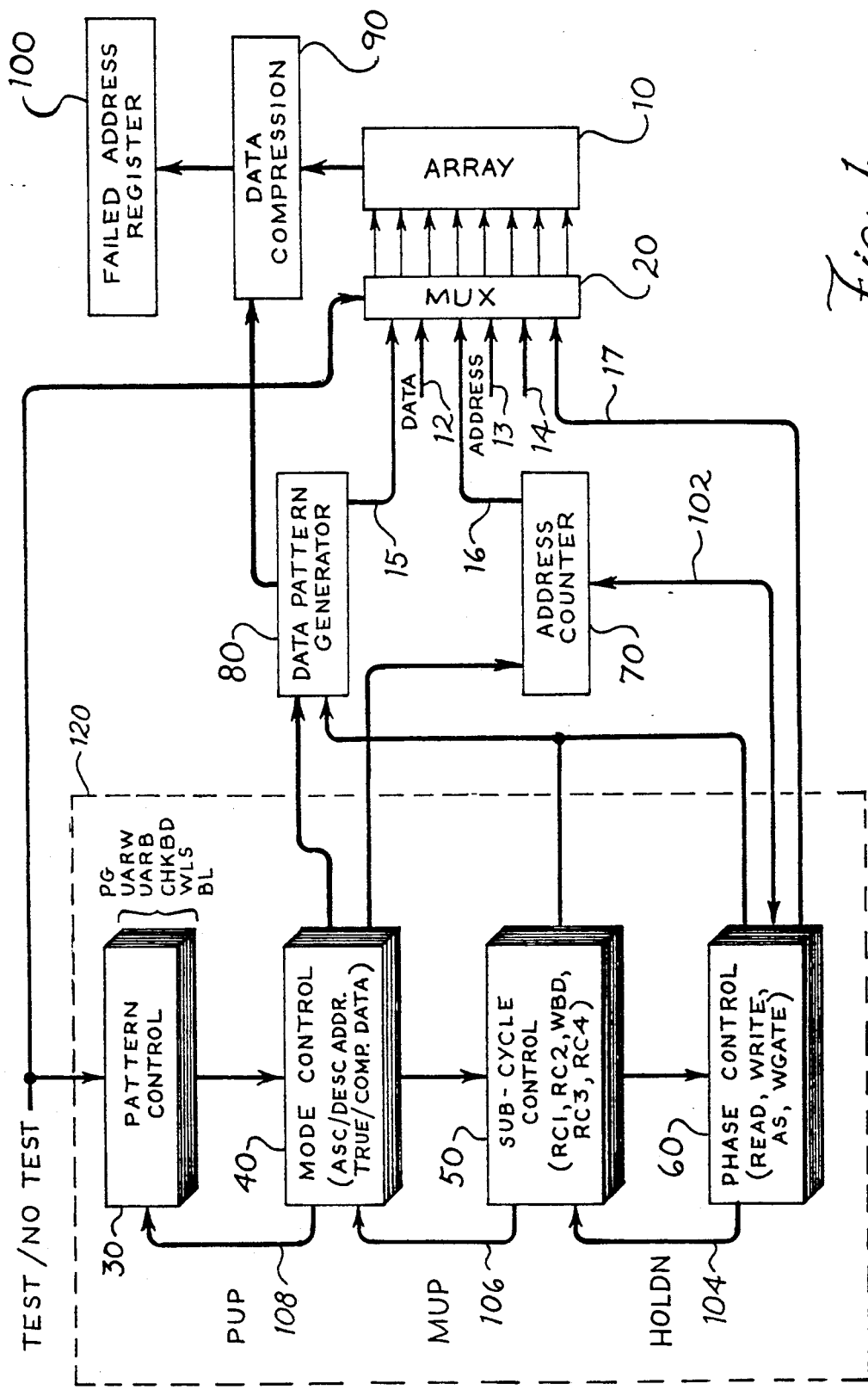
FIG. 1 is a block diagram showing the main functional elements of the preferred embodiment of the present invention.

The preferred embodiment of the present invention is a 6 pattern bist system for embedded SRAM macros. A block diagram of the preferred embodiment is shown in FIG. 1. A convention SRAM array 10 is shown to which the self-test circuit of FIG. 1 interfaces through multiplexer 20, which multiplexes between conventional logic inputs 12, 13 and 14 and the test inputs 15, 16, and 17.

Test control is provided by four functional blocks, pattern control 30, mode control 40, subcycle control 50, and phase control 60. These four blocks control the address counter 70 and data pattern generator 80 to generate the test data and address data for the self-test which are applied to the array 10 through multiplexer 20. The test data is written into the array 10 and then read out to the data compression unit 90 where it is compared against a duplicate of the test data written into the array, regenerated by the pattern generator 80. The results of the comparison are reduced to a single pass fail signal which is made available to the failed address register 100 that captures the address of the word of storage in Array 10 that failed. Together, the pattern control 30, mode control 40, subcycle control 50, and phase control 60 are considered the state machine 120. Operation of the state machine 120 is analogous to a nested Fortran "Do Loop", the outer loop being the pattern control unit 30, and the inner most loop being the phase control unit 60. Each control block 30-60, or "Do Loop," is responsible for maintaining particular information about the pattern being executed.

At a high level, the pattern control 30 points to the specific pattern being executed, and puts the overall bist circuit into a wait state when all patterns have been completed. The preferred embodiment executes 6 patterns, as described below.

The mode control 40 sets the address counter increment/decrement flag, described below, and sets the data pattern generator 80 true/compliment flag, also described below.

The subcycle control 50 maintains the read/write sequence on a per address basis for the current pattern. All six patterns can be broken down into four basic sequences, which are blanket write, blanket read, read-/write/read per address, and the programmable sequence. This is described in more detail below.

The phase control 60 generates and controls the input signal wave forms to the SRAM array 10 on a per cycle basis. It is also responsible for controlling result computation and logging circuits during array read cycles.

The address counter 70 and data pattern generator 80 present input information to the macro, under strict control of the state machine 100. The data compression unit 90 receives output data from the SRAM array and compares it to the expect data computed and provided by the data pattern generator 80. Data compression reduces the full macro data output width to one pass-/fail bit via an exclusive or tree. The array macro 10 accepts input data from logic (not shown) through lines 12, 13 and 14, or the BIST arrangement through lines 15, 16 and 17, through multiplexer 20 under control of a test/no test signal applied to multiplexer 20.

The six patterns executed by the preferred embodiment are unique address ripple word (UARW), unique address ripple bit (UARB), checkerboard (CHKBD), wordline strip (WLS), blanket (BL) and programmable (PG) patterns. All of these patterns, except for the programmable pattern, are effectively "hardwired" while the programmable pattern may be programmed as the to read/write, data and address sequences during scan-in initialization of the logic.

During a typical operational scenario, the phase control unit 60 issues per address read/write commands to the array 10. Data and address inputs are continuously updated in response to various state machine 100 signals. Upon a read operation, expect data is computed by the data pattern generator 80 which is presented to, and latched by the data compression circuitry 90 for data output evaluation. This exercise continues until a maximum address flag is issued by an address compare circuit, described below, in the address counter 70 to the phase control 60 via line 102. The phase control unit 60 responds by issuing its own HOLDN flag to the subcycle control 50 via line 104. Whenever the HOLDN signal goes active, the array 10 is put into a wait state for one cycle to give the state machine 100 time to calculate a new test sequence. In the event that all the read/write sequences for a particular addressing order have been completed, then a MUP flag is sent to the mode control 40 via line 106, instructing it to issue a new data type and addressing order. Once all modes for a current pattern have been exhausted, a PUP signal is sent to the pattern control 30 via line 108 to update the pattern control 30 to a new pattern. This "DO LOOPING", continues until all six patterns have been executed.

FIG. 2 is a table showing in detail the test procession for all six patterns. The far left-hand column identifies the pattern. The middle column identifies the type of operation or operation sequences executed, and their sequence. The third column identifies the addressing order during the operation or operations identified in the middle column.

Signal timings in the circuitry of the preferred embodiment are controlled by dual, non-overlapping clocks, denominated C Clock and B Clock, respectively, in an L1/L2 SRL environment where the array 10 is treated as an L1 entity according to conventional Level-Sensitive Scan Design (LSSD) techniques. See, for example, "Logic Model Optimization For LSSD Structures," by S. Huang, et al., "International Symposium On VLSI Technology, Systems and Applications—Proceedings Of Technical Papers" (1989), pp. 144–148; "Testing VLSI Chips With Weighted Random Patterns," by J. Waicukauski and F. Motika, IEEE International Symposium On VLSI Technology, Systems and Applications—Proceedings Of Technical Papers" (1989), pp. 149–154; "LSSD With Intel Gate Arrays," by R. Swain, Conference Record Midcon 87 v. 11, (Electronic Conventions, Inc. 1987), pp. 203–206; and "Diagnosis of Bist Failures By PPSFP Simulation," by J. Waicukauski, et al., IEEE International Test Conference 1987-Proceedings: Integration of Test With Design And Manufacturing, pp. 480–484, four exemplary articles from the numerous publications available describing LSSD techniques.

As mentioned above, the BIST circuit of preferred embodiment of the present invention operates in an LSSD test environment. As such, the LSSD clock set, namely the A clock, B Clock, and C Clock are utilized in the logic design. In the simplest form of this environment, the A/B clock pair is used to scan initialization data into the BIST circuit. The C/B Clock pair is used to compute and capture new data, and an A/B clock pair is used to scan the result out. The preferred embodiment, however, uses a synchronous double-latch, or master-slave, design in which the C/B clock pairs are used, the C clock being the master and the B clock being the slave. The C clock controls data entering the L1 master and the B clock transfers data to the L2 slave.

The preferred embodiment operates in a boundary scan environment for device test. Boundary scan allows the tester to contact a subset of the total number device inputs and outputs. It is used to test logic before and after a macro boundary. See "Boundary Scan Design For Efficient Testing of LSSD Basics," by R. Bassett, et al., IBM Journal of Research and Development, January 1990, for more detail on the utilization of boundary scan in such testing.

Selection of the patterns for use in self-test of, for example, a memory array, is a difficult and complex problem. It is impractical to include all the tests normally associated with static/dynamic arrays. In the preferred embodiment an effort was made to select the most effective tests from the total set. This allowed a substantial reduction in hardware overhead to implement the preferred embodiment. This is an important consideration, because both small and large arrays include the same BIST implementation. It is desirable to keep the area impact to small arrays as low as possible, of course.

The patterns chosen includes two unique address tests: ripple word and ripple bit. These tests are used to detect cell stuck faults as well as decoder stuck faults in both the word and bit dimension. The ripple word test sets the word addresses as least significant so that the entire word space is toggled before implementing the bit address. The ripple bit test sets the bit addresses as least significant, i.e., normal configuration for the array, and toggles the entire bit address space before incrementing the word address. Both tests are conducted in a R/W/R mode on each address.

The patterns set also includes a word line strip test. This test places opposite cell data on each adjacent word line. This test uncovers adjacency sensitivities as well as bit line restore failures. It is applied by writing initial data to the entire array and reading the data from the entire array for comparison.

The fourth test employed is the four neighbor physical checkerboard. This test is used to uncover charge sharing between a target cell and its 4 physically adjacent neighbors. This test is also conducted in a write-all, read-all manner, as with the word line strip.

Finally, a blanket test is applied as a final test to insure proper operation of the data gates. The blanket test is a repeat of the checkerboard pattern set while control of the data gates is exercised. The blanket test is applied in a write-all, read-all manner. It is used primarily to test special array functions.

At a high level, in operation, the preferred embodiment is activated by placing a logical "1" on the test-/no-test line shown in FIG. 1. Data is then scanned in to initialize the state machine 120 controllers, the address counter 70 maximum address register (described below) data retention register (also described below) array 10 outputs, and the result latch in data compression block 90. Because the preferred embodiment is a fully synchronous LSSD "double-latch" design, execution proceeds on C/B clock pairs. The C clock master captures the next state based on combinational logic data established during the B clock slave cycle. An array 10 access is synchronous with the C clock cycle.

Figure 3:
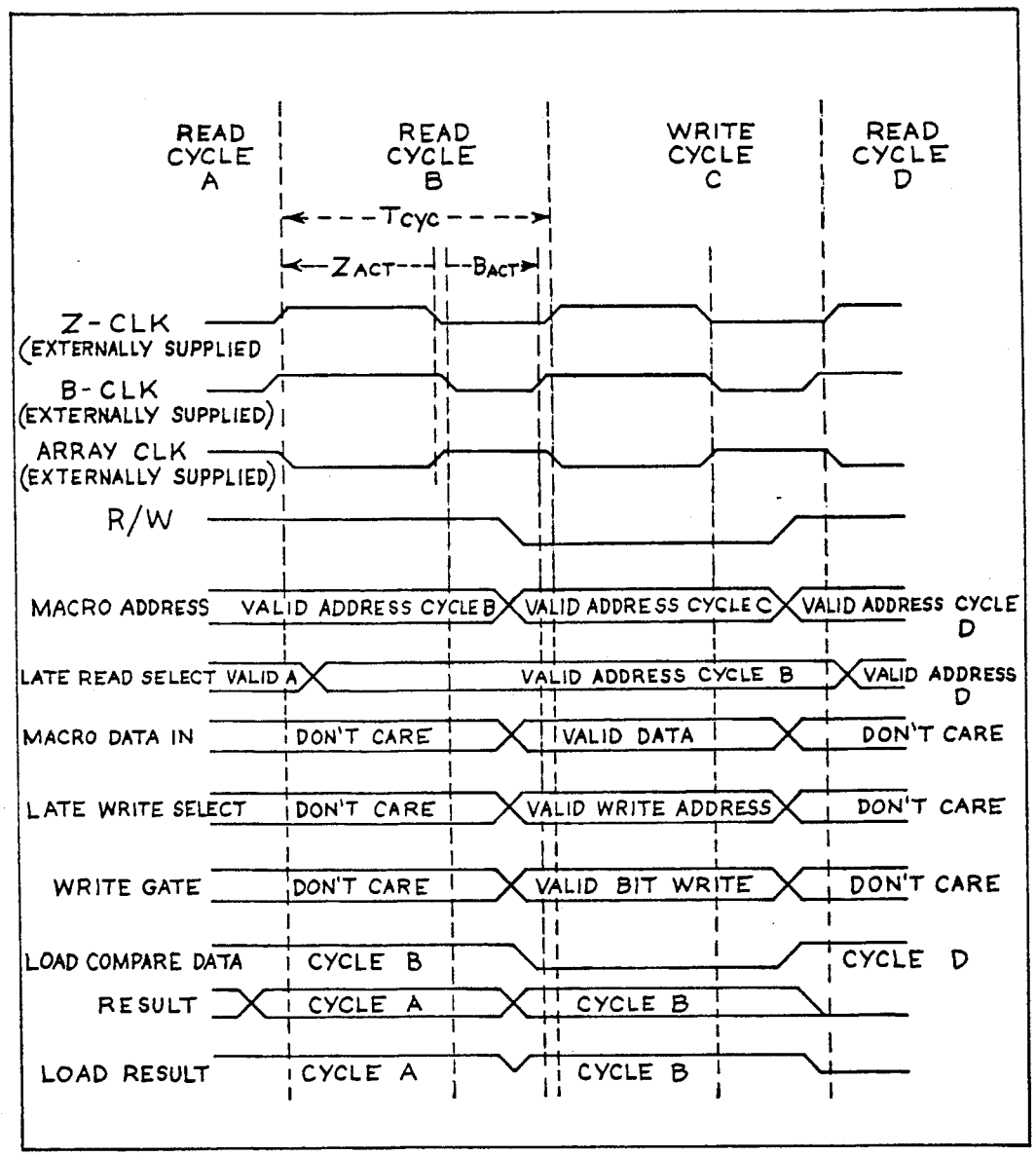
FIG. 3 is a timing diagram showing the relative timing of selected data and control signals during operation of the prefer of the present invention.

FIG. 3 shows in detail the clock and data timings for the preferred embodiment of the present invention. FIG. 3 depicts the end of a read cycle, denominated read cycle a, a full read cycle b which follows, a write cycle c, followed by the beginning of a final read cycle d. At the top of the diagram, the timings of the conventional LSSD BCLK and the conventional array clock are depicted, along with the state of the conventional read/write line. In addition, a Z clock is depicted which is essentially the same as the conventional LSSD C clock. Below the clocks in FIG. 3 are shown the relative timings for various control lines, address lines, and data lines. Thus, the line denominated macro address depicts the relative timings for valid address signals. The late read select, likewise, depicts when the late read select address lines must be valid. The macro data in line depict when the data lines for the array 10 should be valid. The late write select line depicts when the write address lines should be valid for late write operations. The write gate line shows when the write gate mask lines should be valid. The load compare data line shows the timing for loading of compare data for the respective cycles. Likewise the result line and load result line depict the timings for the presence of valid result data and the loading thereof. FIG. 3 should be referred to in conjunction with the detailed description of the various components of FIG. 1 described hereinbelow, for an understanding of the relative timings of the various operations. It will be understood that the exact quantitative placement of the various addresses, data and other signals depicted in FIG. 3 for a particular circuit in a particular design system depends upon the specific parameters of the particular design system and process involved. Selection of these exact quantitative timings is well within the perview of one of ordinary skills in this art area.

Figure 4:
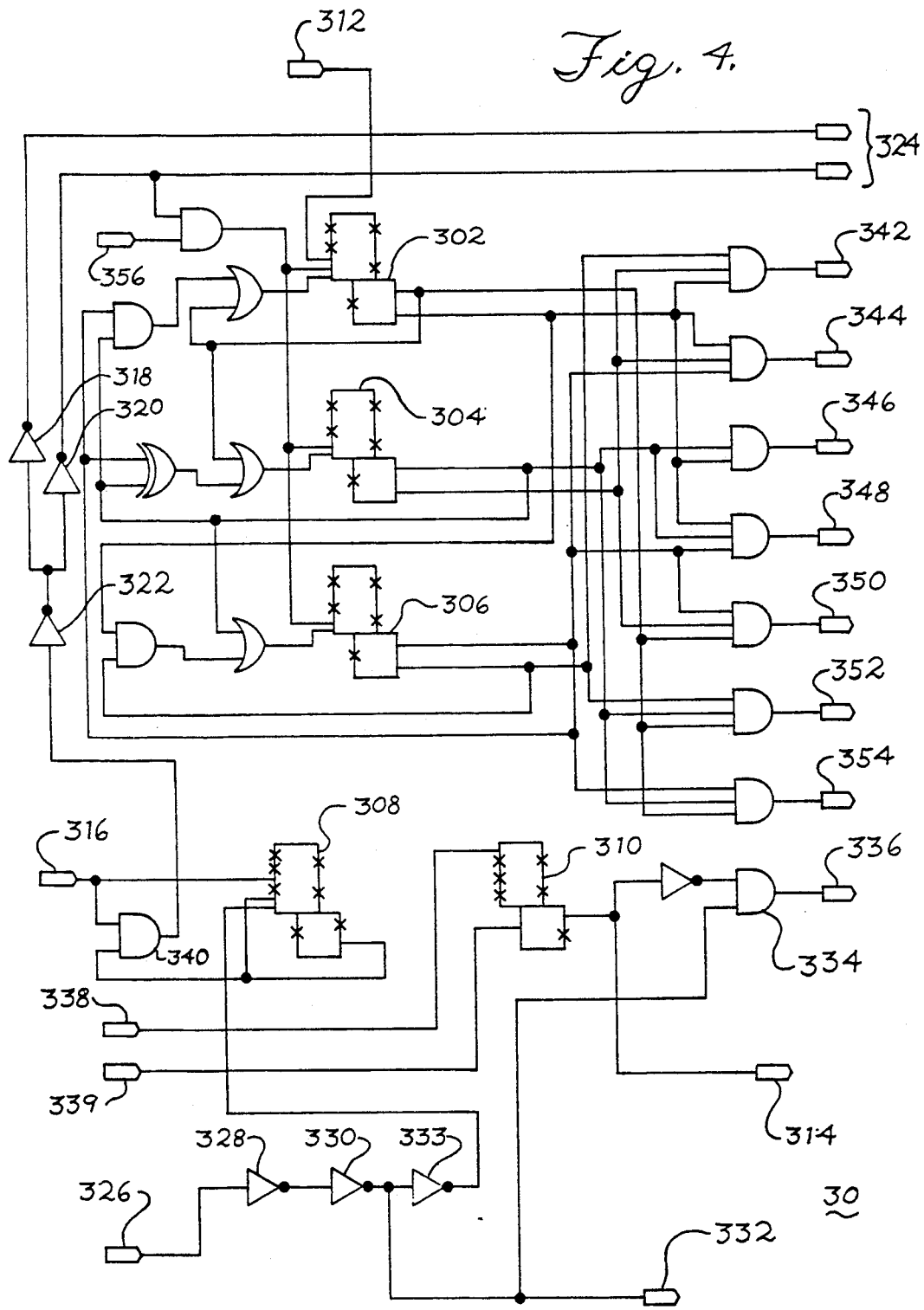
FIG. 4 is a detailed circuit diagram of the pattern control block in FIG. 1.

FIG. 4 is a circuit diagram of the pattern control block 30 of FIG. 1. The heart of the circuit comprises five SLR latches 302, 304, 306, 308, and 310, connected together in LSSD scan chain fashion, receiving data on line 312 from upstream LSSD latches, and providing LSSD output on port 314 to LSSD latches downstream in the LSSD chain. The specific wiring interconnections between the aforementioned latches is not shown in this diagram, for purposes of clarity, however such interconnections are well known in the art. The system C clock is provided to port 316 where it is double buffered by inverters 318, 320 and 322 to become the system Z clock, provided at outputs 324 for fanout to the various other places in the embodiment where Z Clock is called for. The test/no test signal shown in FIG. 1 is applied to input port 326 where it is double buffered by latches 328, 330 and provided as a test/no test signal for the rest of the embodiment at output port 332. The output of inverter 330 is also applied through and gate 334 to output port 336 which is connected to the data multiplexer 20 (FIG. 1) to enable the data and control signals from the preferred embodiment to be applied to array 10, rather than from the surrounding logic, as described above. The output from inverter 330 is also applied through a further inverter 338 to the set input of latch 308, whereby the invert output of latch 308 enables AND gate 340, thus effectively enabling the Z clock at output ports 324, as described above.

The remainder of the circuitry shown in FIG. 4 provides the primary function of pattern control block 30 and comprises a three bit wide counter. The counter is initialized at scan in via input line 312, and thereafter the counter counts up in response to a signal applied to input port 356, synchronized by the Z clock output from inverter 320. The input at input port 356 is the PUP line 108 from mode control 40, shown in FIG. 1. Each of the output ports 342-354 corresponds to a different pattern to be executed on array 10 (1). As the counter counts, these lines go active separately and sequentially, starting with the initialized value. FIG. 5 is a table showing the correspondence between the count number and the active output port.

Figures 6, 7:
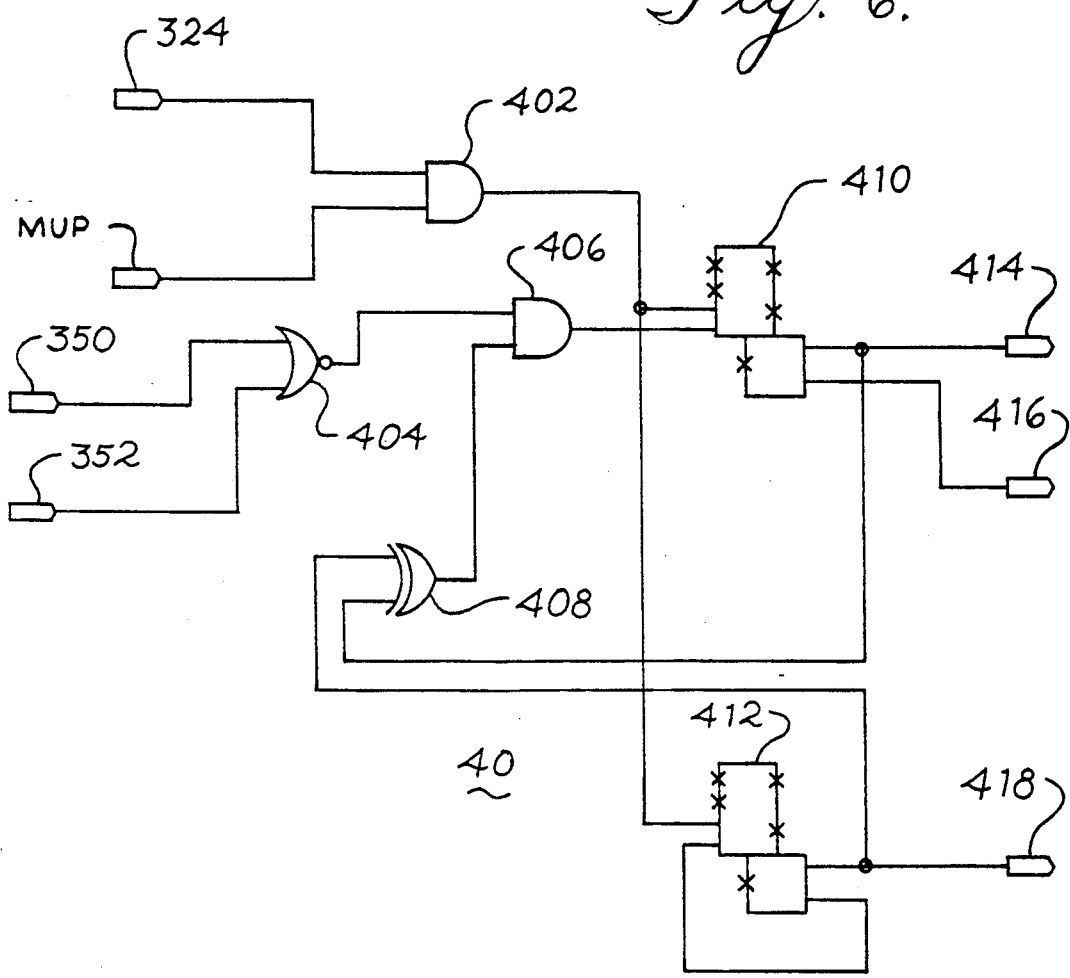
FIG. 6 is a detailed circuit diagram of the mode control block of FIG. 1.
FIG. 7 is a state diagram showing the logic operation of the circuit shown in FIG. 6.

FIG. 6 is a circuit diagram of the mode control logic block 40 shown in FIG. 1. As can be seen, an AND gate 402 receives the Z clock on input port 324, which corresponds to output port 324 in FIG. 4, and the MUP signal shown in FIG. 1. A NOR gate 404 receives the CH signal at input port 350 and the BL signal at input port 352, corresponding to output ports 350 and 352 respectively, in FIG. 4. AND gate 406, exclusive or gate 406, and SRL latches 410 and 412 comprise a modulo four counter clocked by the MUP signal, and synchronized by the Z clock signal, which is modifiable by activation of either port 350 or 352 to a modulo two counter. The output of port 414 represents a mode of ascending address counting when at state 0, and descending address count at state 1. Port 416 is the compliment of port 414. Port 418 represents true data when 0 and compliment data when 1. This pattern is summarized in the table in FIG. 7. Thus, in all patterns, except CH and BL, all four states shown in FIG. 7 are cycled for each pattern. For pattern CH and BL, however, port 414 is held low, and only ascending address count is used.

Figure 8:
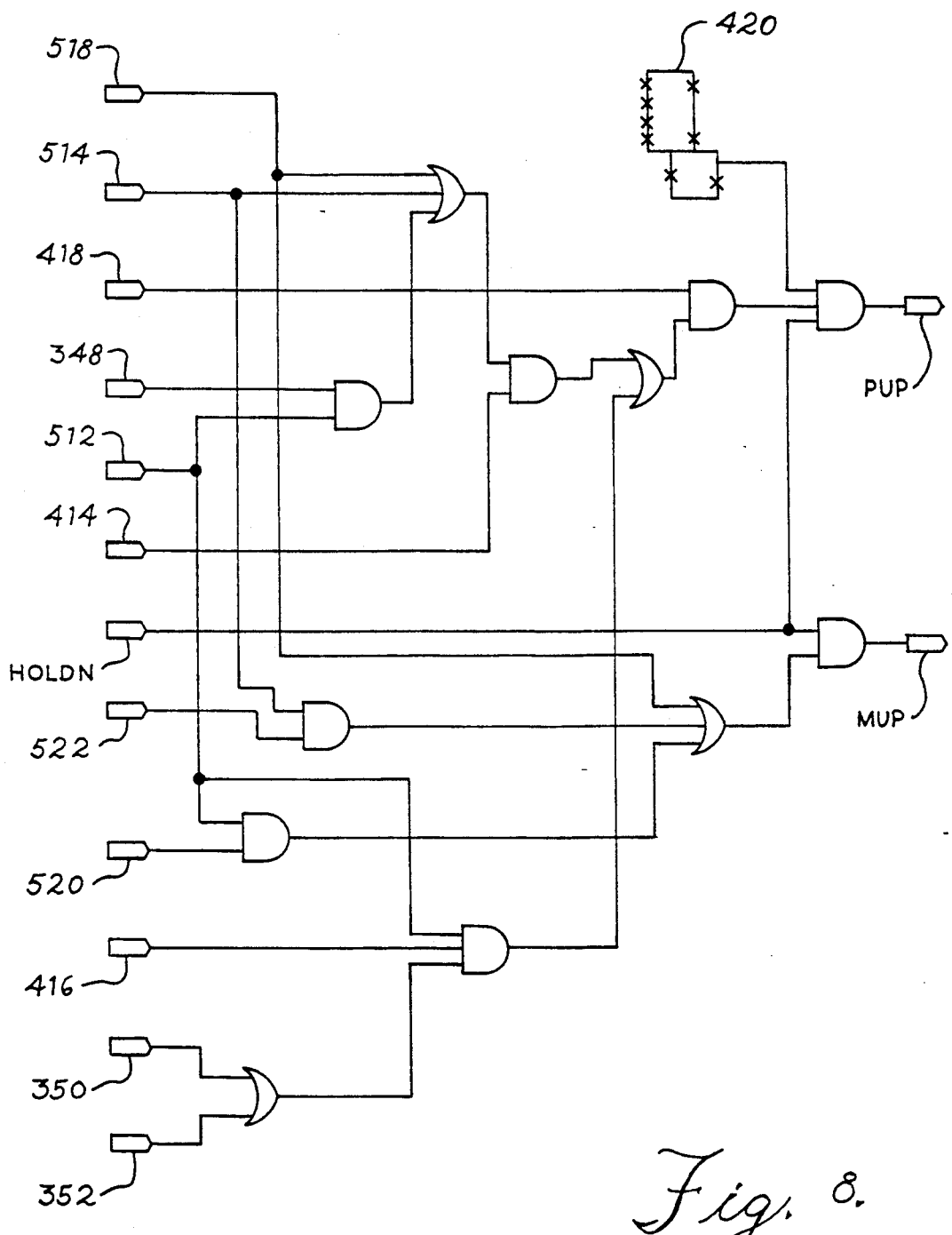
FIG. 8 is an update logic circuit that operates in conjunction with the mode control block 40 and subcycle control block 50 of FIG. 1.

For purposes of chip layout efficiency, the circuitry for generating the update signals MUP and PUP, shown in FIG. 1, for the subcycle control block 50 and mode control block 40, respectively, was combined in a single circuit. The circuit is shown in FIG. 8 and is called the update logic circuit. The signals on output ports 414, 416 and 418 of FIG. 6 are applied to input ports 414, 416, and 418, respectively, of the circuit in FIG. 8. Its operation is described below, after the signals applied to the other input ports have been described.

Figures 9, 10:
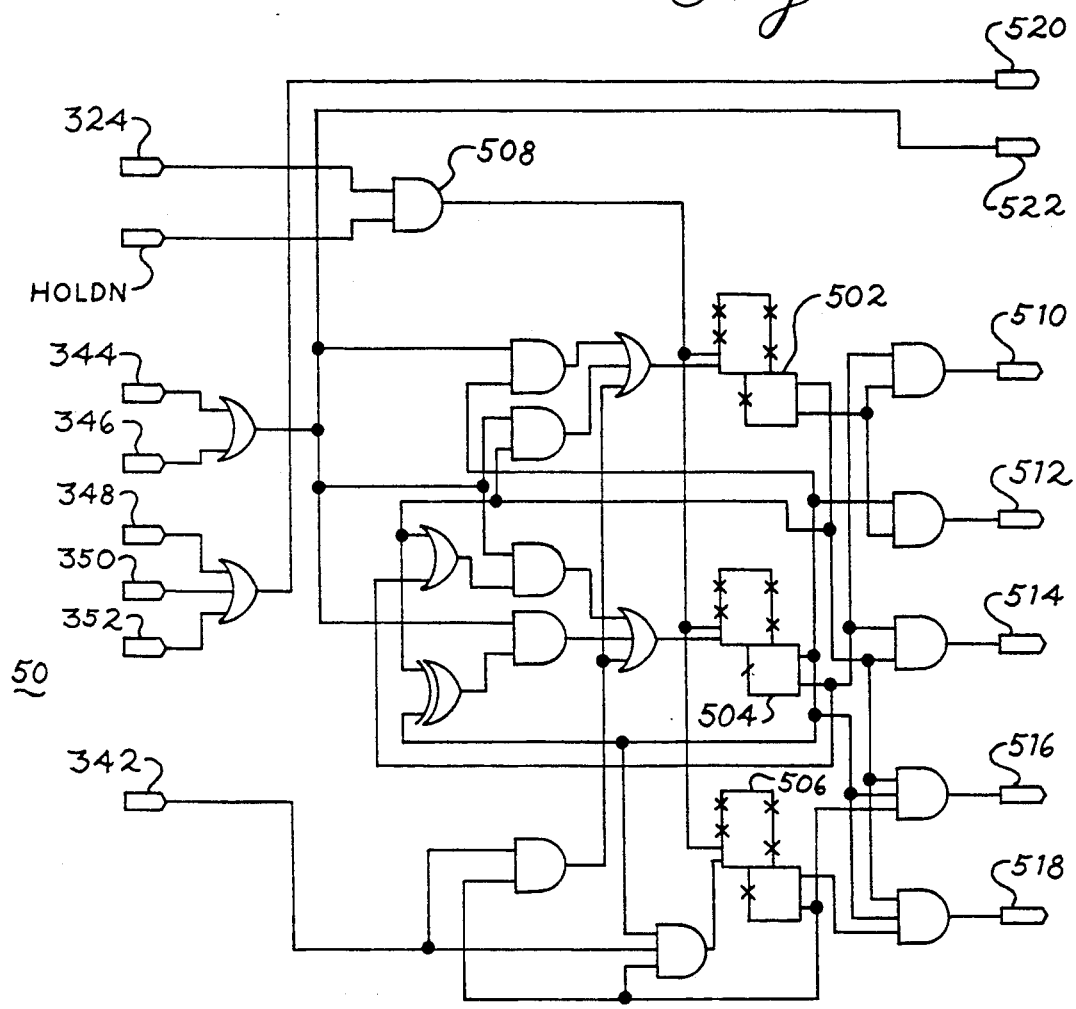
FIG. 9 is a detailed circuit diagram of the subcycle control block of FIG. 1.
FIG. 10 is a state table showing the logic operation of the circuit of FIG. 9.

FIG. 9 is a circuit diagram of the subcycle control block 50 shown in FIG. 1. At its heart are three SRL latches 502, 504, and 506, operating as a modulo-3 or modulo-2 counter, depending upon the input states. The reason the modulo is either 2 or 3 is as follows: In programmable pattern mode, PG, the sequence of operations is write background data (WC), Read Write Programmable True (RWPT), Read Write Programmable True/Complement (RWPT/C), and then the MUP signal goes active signaling the mode control block 40 to go to its next operation in its sequence (1). In both UARW and UARB pattern modes, the sequence mode is WC, RWRT, RWRC, and then MUP goes active as above. These three respective signal lines in the sequence just described. In WLS, CK and BL pattern modes, however, the sequence is WC, RWRT, and then MUP is activated. Clearly, this requires a modulo-2 counter.

The Z clock from FIG. 4 is applied to input port 324, which is connected to one input of an AND gate 508, while the HOLDN signal shown in FIG. 1 is applied to the other input of AND gate 508. The output of AND gate 508 clocks the counter 502, 504, 506. The signals applied to input ports 342, 344, 346, 348, 350 and 352 are the respective outputs from FIG. 4 bearing the reference numerals. It should be recalled that each of those signals represents a different one of the six possible patterns.

The output of counter 502, 504, 506 is decoded to activate outputs 510, 512, 514, 516, or 518, exclusively. When output port 510 is active background data is written, i.e., a blanket write is executed. When output port 512 is active a read/write/read sequence with true data is executed. When output port 514 is active a read/write/read with compliment data is executed. When output port 516 is active a read/write/programmable pattern is executed, with true data. Finally, with output port 518 active, a read/write/programmable (RWPT) pattern is executed with true data in the normal mode, but selectable to enhance programability to compliment data as well. The operation of the circuit of FIG. 9 is summarized in the logic table shown in FIG. 10.

Referring again to FIG. 9, output ports 520 and 522 are signal lines which, when active, signal a write/read sequence of operations and a read/write/read sequence, respectively, without reference to data type.

Referring now to FIG. 8, the remaining input ports may be identified with their respective output ports of the same reference numeral in FIG. 9. Finally, still referring to FIG. 8, note the shift only SRL latch 420. It will be appreciated that when loaded with a "1" at initialization, the system operates normally. However, if a "0" is loaded in latch 420 at initialization, the PUP control signal is effectively disabled and, thus, whatever initial pattern is selected during scan-in initialization, that pattern repeats continuously in looping fashion until either the system clock is disabled or the test/no-test signal line is deactivated (1). This capability is extremely useful in burn-in operations when it is desired to repeatedly execute a chosen pattern for long periods to severely stress the array 10 and store fail information.

Figures 11, 12:
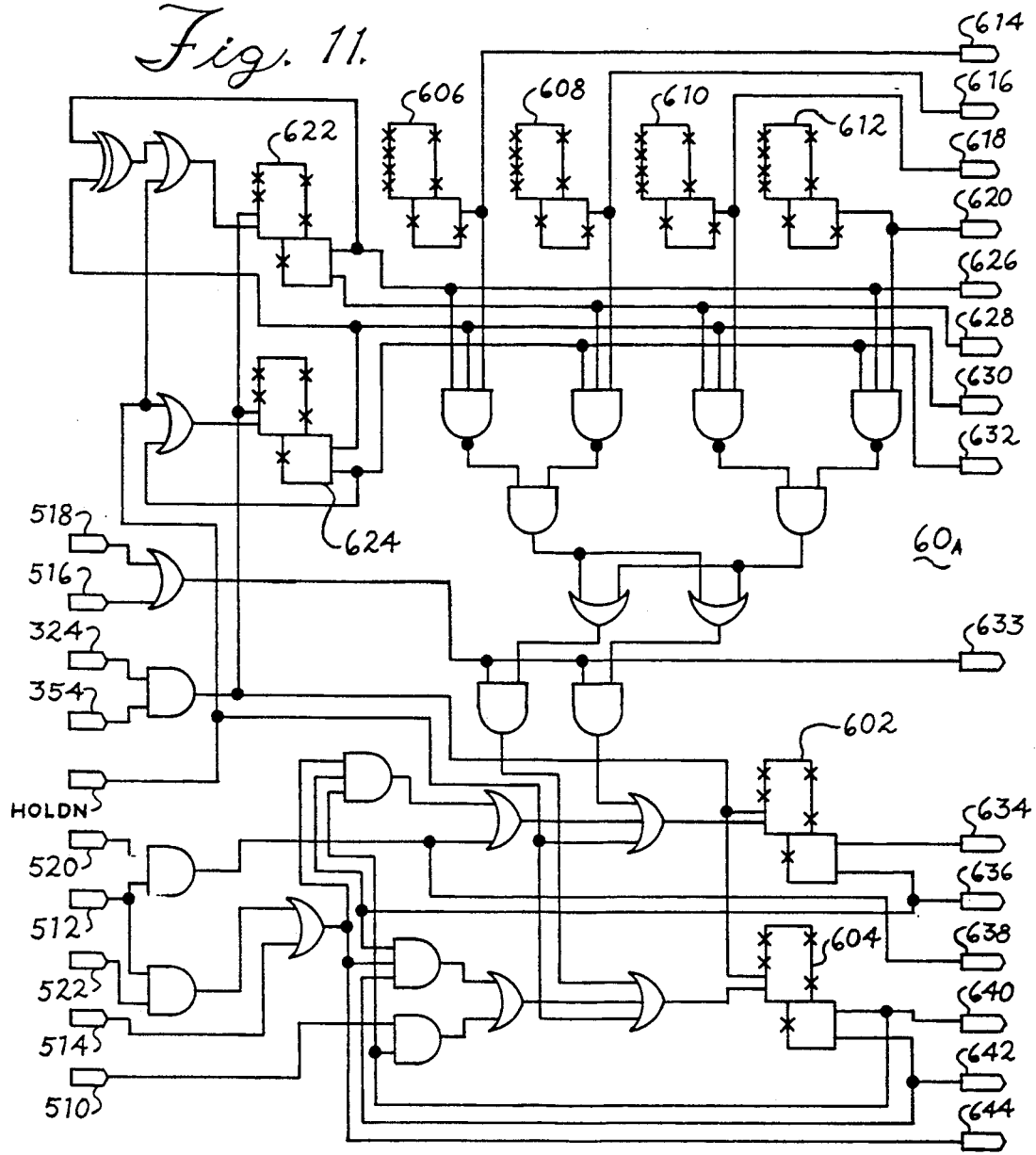
FIG. 11 is a detailed circuit diagram of a first half of the phase control block of FIG. 1.
FIG. 12 is a state table showing the logic operation of the circuit shown in FIG. 11.
Figure 13:
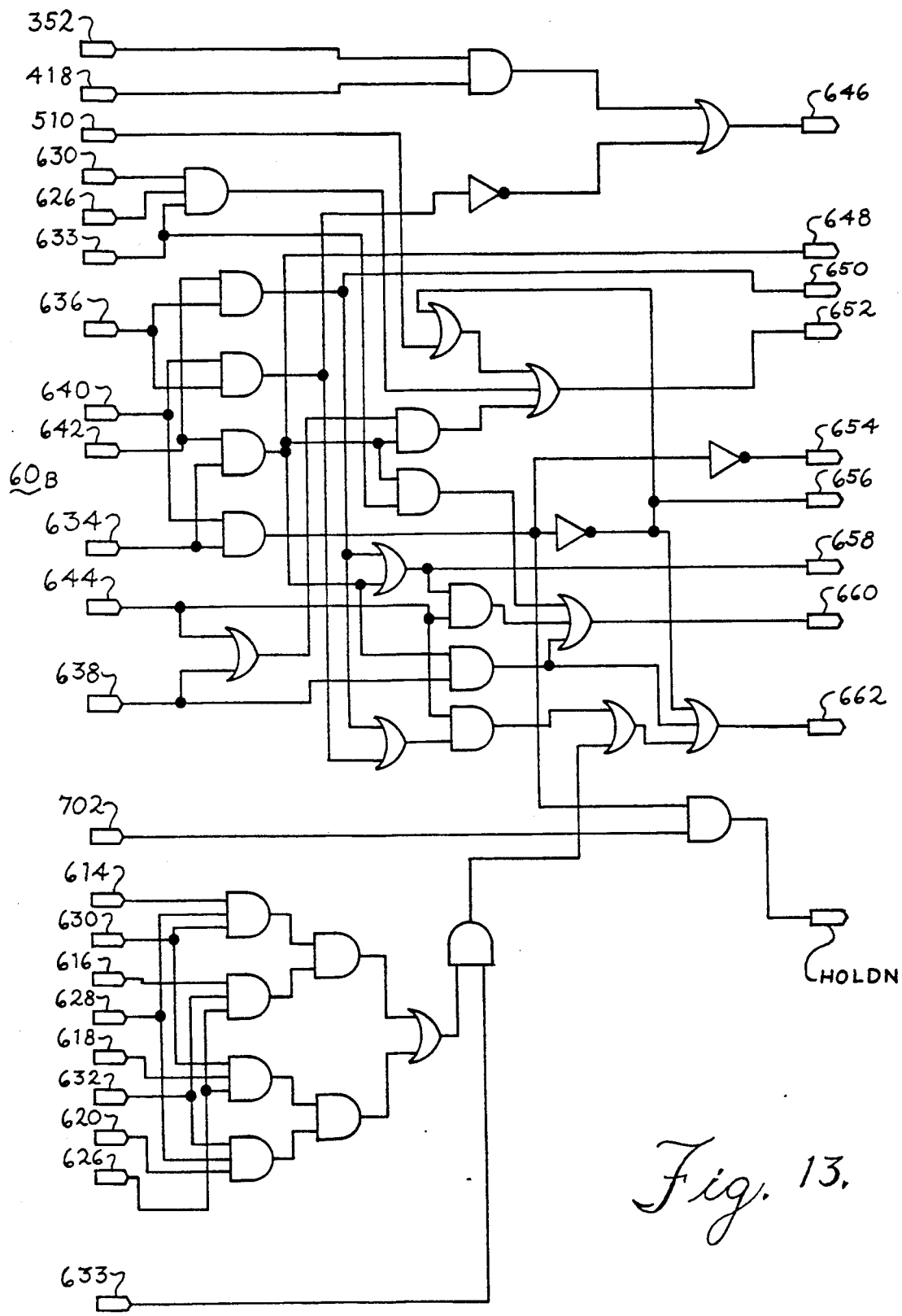
FIG. 13 is the other half of the phase control circuit of FIG. 1, the first half being shown in FIG. 11.

FIGS. 11 and 13 together comprise the phase control block 60 of FIG. 1, FIG. 12 being a state table used in understanding FIG. 11. The phase control block 60 is the final and most complex functional block of the state machine 100. This functional block generates the control signals for the array 10. It also directly controls address stepping, influences data pattern generation to the array and expect data, and controls result logging in the failed address register 100 (FIG. 1). Inputs from the pattern control unit 30 and subcycle control unit 50 determine the state transitions. Four states are possible in the phase controller, namely, read phase a, write phase a, read phase b, and wait, as shown in FIG. 12. These states are generated by a modulo-1 to -4 counter, depending on input logic signals, comprising two SLR latches described below. If a R/W/R sequence is required, the phase controller sequences through RA/-WA/RB for each address in the array. In the case of a pattern that writes the entire array, then reads it, the phase control unit 60 executes the WA state for all addresses for the write, and then executes the RB state for all addresses for the read and compare. During initialization, the phase control unit 60 is set on the WA state in order to initially write data to the entire array. One wait cycle is always activated during the WA or RB state when the addresses have entirely counted up or down. The wait cycle is the first sequence in all patterns. This cycle is required to allow the pattern, subcycle, and mode controllers 30, 50, and 40, respectively, to determine the next course of action. It also triggers an address counter reload from the maximum address register, described below in connection with the discussion of address counter 70, to begin a new sequence.

Referring now to FIG. 11, the signal on output port 518 of FIG. 9, corresponding to RWPC/T, is applied to input port 518. The signal on output port 516 of FIG. 9, corresponding to RWPT, is applied to the input port 516. The Z clock from FIG. 3 is applied to input port 324, while the NOPN signal from FIG. 3 is applied to input port 354. HOLDN is applied as shown. The signals on output ports 510, 512 and 514 from FIG. 9, corresponding to the write background data signal, RWRT signal, and the RWRC signals, respectively, are applied respectively to input ports 510, 512 and 514 of FIG. 11. The WR and RWR signals from output ports 520 and 522, respectively, of FIG. 9 are applied to input ports 520 and 522 respectively in FIG. 11.

Referring again to FIG. 12, the aforementioned four states are generated by a counter comprising SRL latches 602 and 604.

Four other SRL latches 606, 608, 610 and 612, which are scan-only SRLs, are loaded with a code representing, in the case of a "1", read, and in the case of a "0", write. In program pattern mode the pattern cycle through four operations of read or write, corresponding to the contents of latches 606–612. The contents of these SRL latches is applied to the logic shown in FIG. 11, and also, by way of output ports 614, 616, 618, and 620, to the logic shown in FIG. 13. SRL latches 622 and 624, and the logic associated therewith, provide two complimentary sets of output signals 626 and 628, and 630 and 632, which are applied to the circuitry in FIG. 13. Finally, output ports 634, 636, 638, 640, 642 and 644 complete the set of signals which are provided to the circuitry in FIG. 13.

Referring now to FIG. 13, the signals applied to the input ports of FIG. 13 are taken from the output ports of FIG. 11 having the corresponding reference number. In addition, the BL signal from output port 352 of FIG. 4, the signal on output port 418 of FIG. 6, and the signal on output port 510 of FIG. 11 are applied to the input ports bearing the respective corresponding reference numeral in FIG. 13. Finally, an address compare (AC) signal from the address counter 70 (1) described below is applied to input port 702.

The combinational logic of FIG. 13 operates to decode the various input signals described above and provide as outputs signals which will now be described.

The signal on output port 646 is the self-test bit write control (STBWC) signal. This line connects to array 10 (FIG. 1) to each of the bit write control inputs thereof, to activate all 18 bits simultaneously, according to conventional memory array access principals. The signal at output port 648 is applied to the address compare circuitry, described in more detail below, to synchronize the comparison of the output of the address counter 70 (FIG. 1), with the contents of the maximum address register (not shown) that holds the value of the maximum address of the array. The signal on output port 650 is applied to the data manner described in more detail below. The signal on output port 652, denominated ACOUNT, is applied to the address counter 70, (FIG. 1) to enable counting. The signal on output ports 654, denominated the self-test array select not (STASN) is inverted and applied to the array 10 (FIG. 1) select input, according to conventional memory array access principals. The signal on output port 656, denominated the wait signal, is activated when going from the maximum to the minimum address in the address counter 70 (FIG. 1), and vice versa. This signal, internal to the logic shown in FIG. 13 deactivates the address counter signal on output port 652, and also is applied to the address counter 70 (FIG. 1) to activate reset circuitry therein. The signal on output port 658 is applied to array 10 (FIG. 1) and indicates whether the current operation is a read or a write. The signal on output port 660, denominated the load expect data (LD) signal is applied to circuitry (not shown) to enable the loading of expect data into registers in the data compression block 90 (FIG. 1) for pass/fail comparison. This signal is also applied to the failed address register, described below, to load the accumulator register in a manner described below. The signal on output port 662, denominated the load read result (LR) signal is applied to the failed buffer register SRL latches to activate the storage of fail information, in a manner described in more detail below. Finally, the HOLDN signal identified in FIG. 1 is provided at the output port shown below, output port 662.

Figure 14:
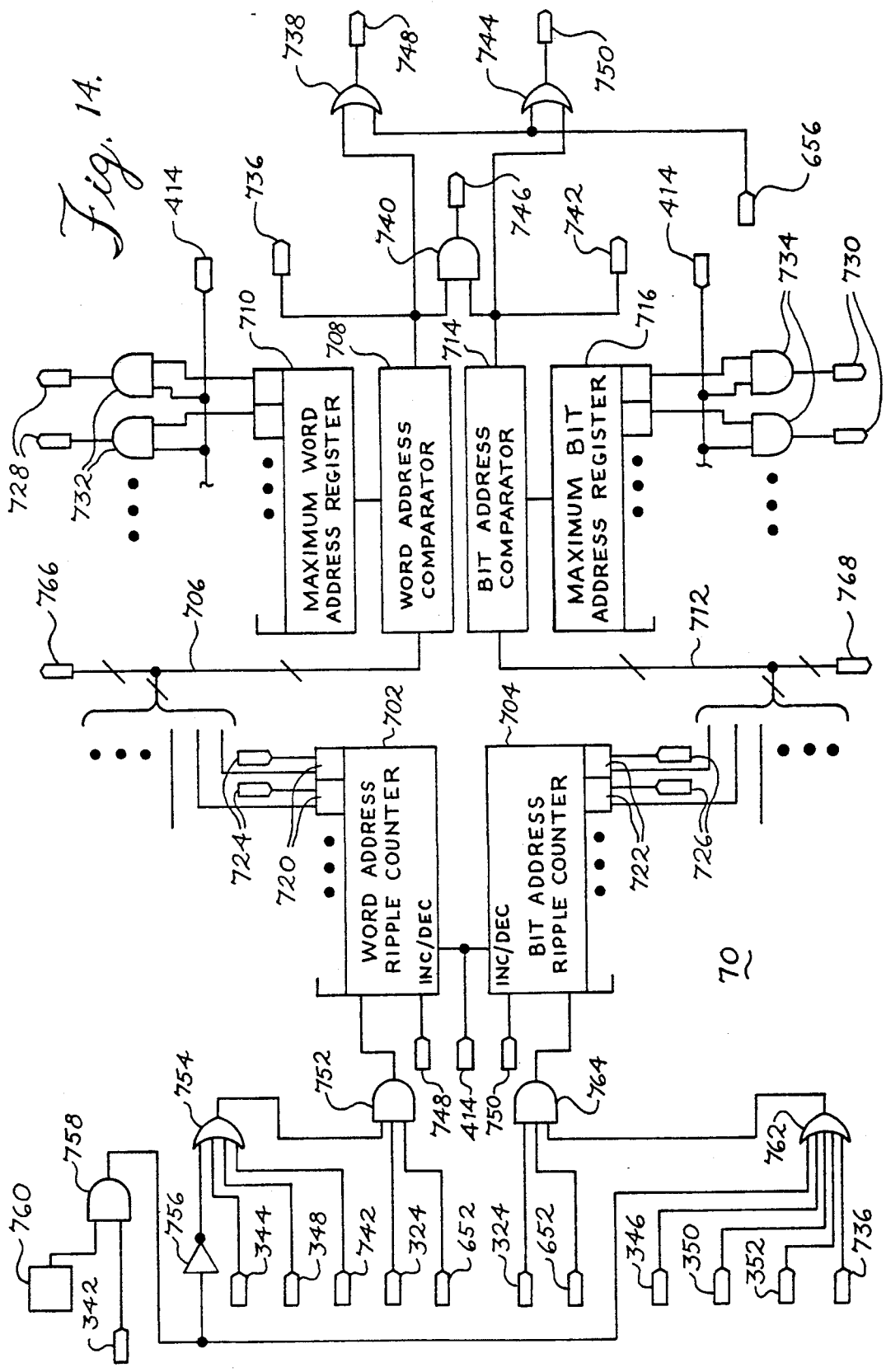
FIG. 14 is a detailed circuit diagram of the address counter of FIG. 1.

FIG. 14 is a more detailed description of the address counter 70 shown in FIG. 1. At the heart of the counter 70 are two programmable, up/down, resetable ripple counters 702 and 704. Counter 702 provides the count for the word address, while counter 704 provides the count for the bit address. The output of the word address ripple counter 702 is provided, via line 706 to a conventional comparator 708 for comparison against the contents of a register 710 which holds the maximum word address for the array 10 (FIG. 1). Similarly, the output of the bit address ripple counter 704 is provided, via line 712, to a further conventional comparator 714 for comparison against the contents of a further register 716 holding the address of the maximum bit, i.e., the width of a word in array 10 (FIG. 1).

Note that the word address ripple counter is comprised of a number of SRL shift registers 720, as is known, and similarly the bit address ripple counter is comprised of counter bits 722. Only two such bits are shown in each case, for representative purposes. The individual outputs of these shift registers are shown, which become the respective data buses 706, 712, respectively. In addition, inputs thereto, 724 and 726, respectively, contain the reset data information for the value to which the respective counter 702, 704, are reset when a reset occurs. These data values are provided 728 and 730 of AND gates 732 and 734, respectively. These AND gates have as one input thereto the outputs of the maximum word address register 710 and the maximum bit address register 716, respectively, while the other input thereto is the AD line 414 shown in FIG. 6. The AD line 414 synchronizes the loading of the reset data in counter 702 and 704. It is also applied to the INC/DEC (increment/decrement) inputs of counters 702 and 704.

When the word address comparator detects a comparison it puts out an output signal denominated address compare word (ACW), which was provided on output port 736. This signal is also provided as an input to an OR gate 738 and an AND gate 740. Similarly, when the bit address comparator 714 senses a comparison it outputs a signal denominated address compare, bit (ACB), which is made available on output port 742 and provided as an input to OR gate 744 and to AND gate 740. The other input to OR gates 738 and 744 is the wait signal from output port 765 of FIG. 13. The signal on output port 746 the address compare (AC) signal, representing the occurrence of a compare in both the word address comparator 708 and the bit address comparator 714. Output port 748 and 750 are signals denominated WORDGATE and BITGATE, respectively, which are applied to the reset inputs of the word address ripple counter 702 and bit address ripple counter 704, respectively, via input port 748 and 750, as shown in FIG. 14. The wait signal from output port 656 of FIG. 11 synchronizes the application of the reset signals to counters 702 and 704.

Clocking of the word address ripple counter 702 is controlled by the output of AND gate 752. Inputs to AND gate 752 are the Z clock from output port 324, the ACOUNT signal from output port 652 of FIG. 13 and the output of a four input OR gate 754. The inputs to OR gate 754 are the UARW signal from output port 344 of FIG. 4, the WLS signal from output port 348 of FIG. 4, the ACB signal from output port 742 of FIG. 14 and the output of an inverter 756 receiving its input from an AND gate 758 having as its input the PG signal from output port 342 of FIG. 4 and the output of a scan only SRL 760. The function of SRL 760 is to control whether counter 70 is to operate in ripple word or in ripple bit mode when in the program pattern mode indicated by activation of input port 342. A "0" signifies ripple word while a "1" signifies ripple bit in this mode. Note that the output of AND gate 758 is also connected to a further four input OR gate 762 which operates with AND gate 764 to clock bit address ripple counter 704, in analagous fashion to OR gate 754 and AND gate 752 clocking the word address ripple counter 702. AND gate 764 has as its inputs the ACOUNT and Z clock signals on input ports 324 and 652, as well as the output of OR gate 762. OR gate 762 has as inputs, in addition to the output of AND gate 758, the UARB signal from output port 346 of FIG. 4, the CH signal from output port 350 of FIG. 4, the BL signal from output port 352 of FIG. 4, and the ACW signal from output port 736 of FIG. 14. Together all of these control signals operate to control the counting of counter 70 to cycle through the addressing appropriately for the bit pattern being exercised. Note that output ports 766 and 768 provide the address data for word and bit, respectively, to the array 10 (FIG. 1).

Figure 15:
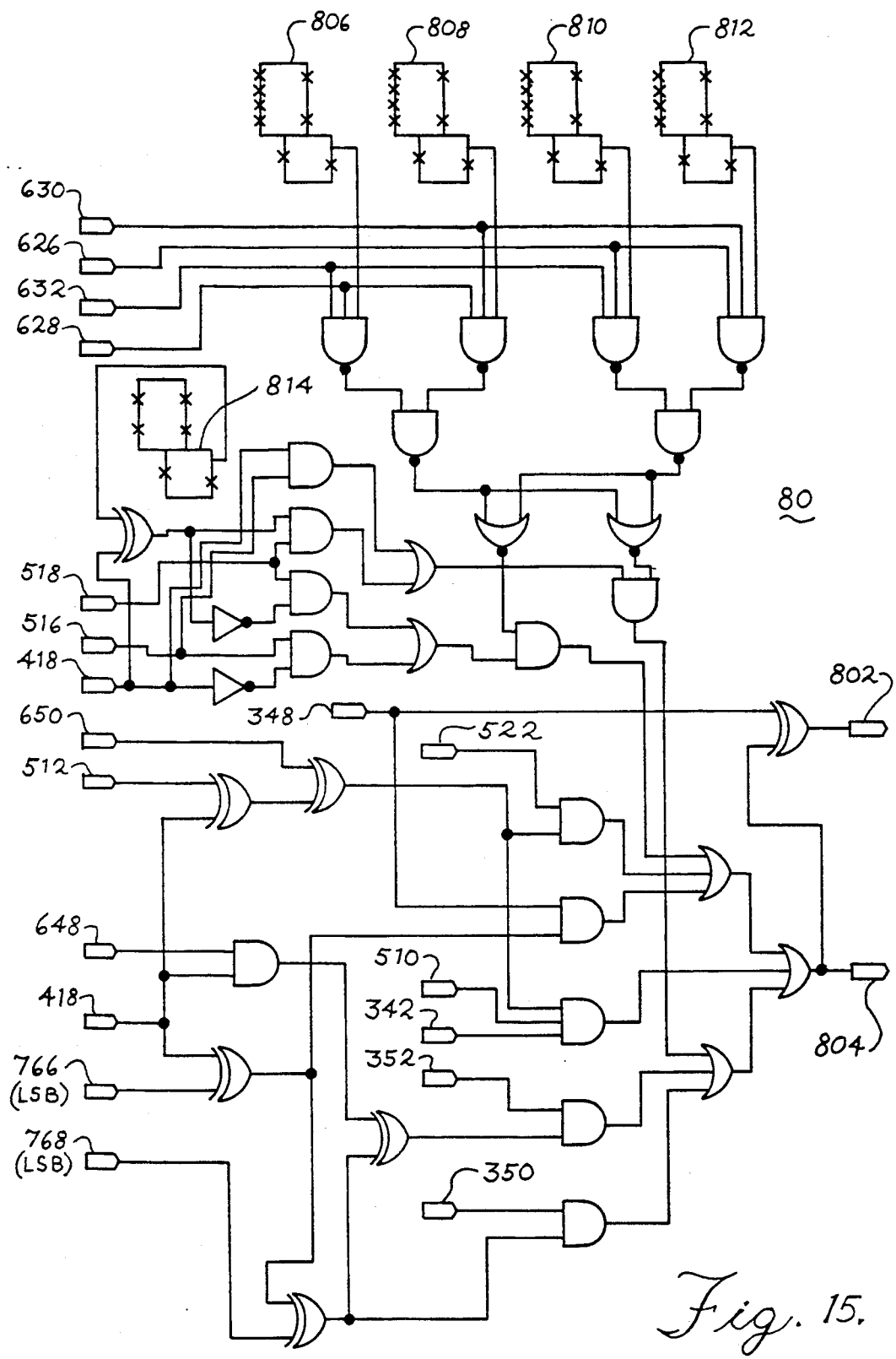
FIG. 15 is a detailed circuit diagram of the data pattern generator of FIG. 1.

FIG. 15 is a circuit diagram of the data pattern generator 80 shown in FIG. 1. Referring to FIG. 1, it can be seen that the data pattern generator 80 receives input signals from numerous sources. The various inputs to the data pattern generator 80 shown in FIG. 15 can be traced to their sources in the other diagrams described above by tracing the reference numbers associated with the input port in FIG. 15 with the corresponding reference numeral in the output port in the appropriate diagram described above. Thus, for example, the signals on input ports 630, 626, 632, and 628 shown at the upper left of FIG. 15 can all be traced to corresponding output ports bearing the same reference numbers in FIG. 11.

Output ports 802 and 804 in FIG. 15 provide the appropriate data for the array 10 (FIG. 1) and data compression unit 90 (FIG. 1), as the case may be, as called for in the sequence of events controlled in the BIST machine. Note that output port 802 fans out to alternating bit positions in the one-word wide input data line 15 (FIG. 1), while output port 804, likewise, fans out to the other alternating bit lines in data line 15. This arrangement permits data to be read into a word location in array 10 having alternate values in adjacent bit positions. The particular connection showing this arrangement is not shown in a figure herein, but the principal will be readily understood by those skilled in the art. The various logic circuitry shown in FIG. 15 operates to control the sequencing of data on output ports 802 and 804 to provide the appropriate data at the appropriate time according to the pattern enabled by pattern control block 30 (FIG. 1).

Four scan-only SRLs 806, 808, 810 and 812, will be noted at the top of FIG. 15. These SRLs are used in conjunction with PG pattern mode, and are loaded at initialization. These four SRLs correspond, respectively, to SRLs 606, 608, 610 and 612 shown in FIG. 11. The later SRLs in FIG. 11 are utilized in the PG pattern mode to identify whether a read or a write occurs during each of the four operations characteristic of PG mode, as discussed above. SRLs 806, 808, 810 and 812 contain the true data value associated with the operation indicated in its corresponding register in FIG. 11.

Scan-only SRL 814 controls whether true or complement data is actually generated in RWPC/T mode, "0" representing true data and "1" representing complement data.

Output ports 802 and 804 together, as fanned out, represent either write data or expect data, depending upon whether a read or a write is occurring in the BIST machine.

Figure 16:
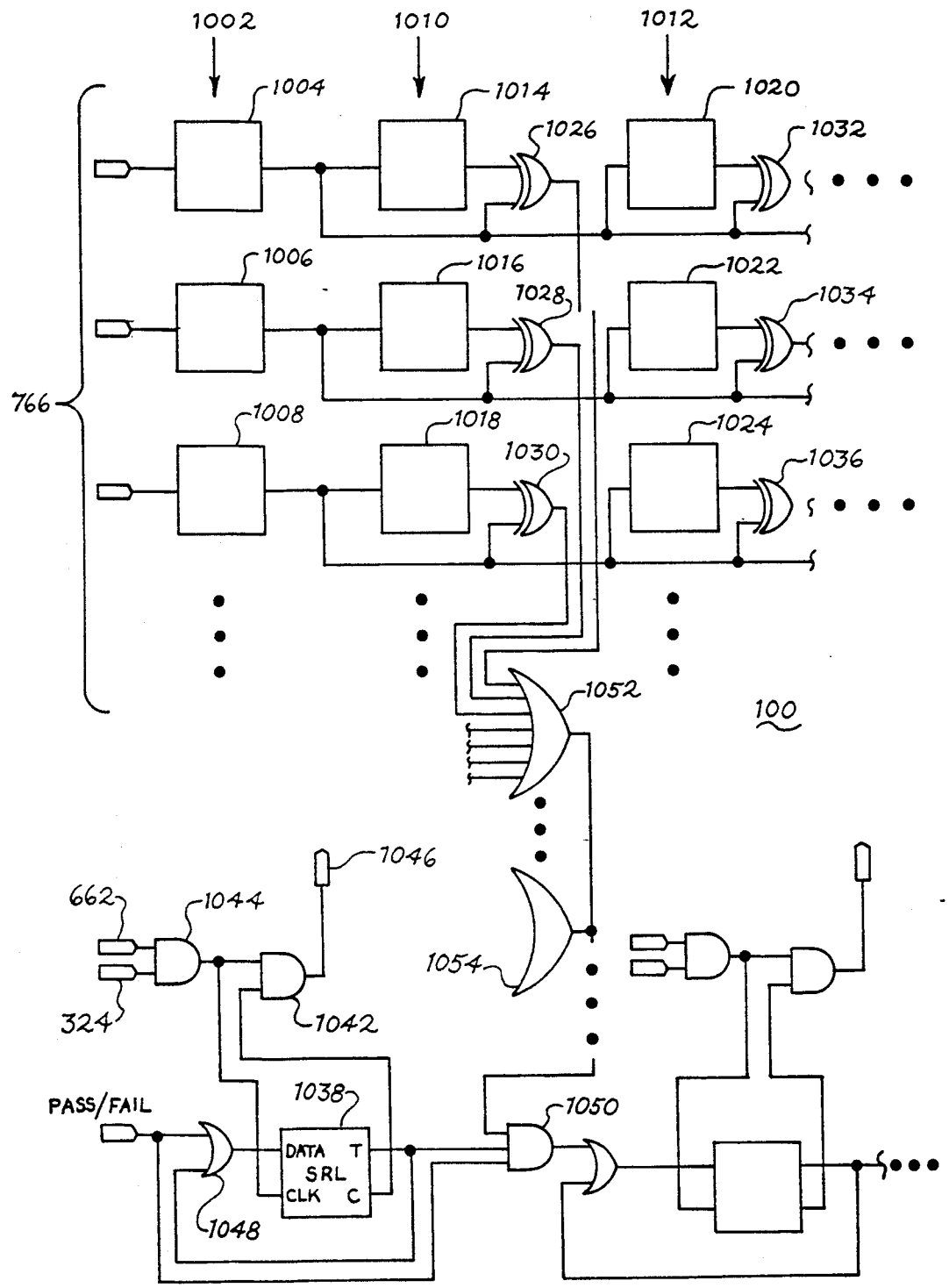
FIG. 16 is a detailed circuit diagram of the fail address register block of FIG. 1.

Finally, FIG. 16 is a circuit diagram of the fail address register block 100 shown in FIG. 1. Register block 100 actually comprises a series of registers. The first register 1002 is a series of SLR latches 1004, 1006, 1008, and so forth, as shown. Further registers are provided, as depicted by register 1010, 1012 and so forth. Registers 1010 and 1012 have the same number of registers as that in register 1002, for the same considerations. They are referenced as shown. A plurality of exclusive OR gates 1026, 1028, 1030 and so forth and 1032, 1034, 1036 and so forth, are provided as shown. Their function is described below.

The input to the accumulator register 1002 is provided by the word address signal line 766 from FIG. 14. Register 1002 is always loaded with the current address information. The loading of the subsequent registers 1010, 1012 and so forth, is controlled by a circuitry which will now be described.

After initialization, SRL 1038 is loaded with a "0". The compliment output, therefore, is a "1". This complimentary output is provided on line 1040 to one input of an AND gate 1042. The other input of AND gate 1042 is the output of a further AND gate 1044 having as inputs the LR signal from output 662 of FIG. 13, and the Z-CLK signal from output 324 of FIG. 4. Output port 1046 is applied to the clock inputs of all of the SRLs of register 1010.

In operation, during a read cycle an address is applied to the inputs of register 1002. In the next cycle, the address data in register 1002 is applied to the inputs of all subsequent registers, including register 1010, the data is latched, and, if a fail result occurs the pass/fail input port goes high causing SRL 1038 to latch a "1", resulting in disablement of AND gate 1042. The true output of SRL 1038 is applied through OR gate 1048 to the data input of SRL 1038, resulting in a permanent latch of that state. Thus, register 1010 is disabled from the latching of any further data, effectively capturing the address where the fail occurred. Identical circuit structures as that comprising AND gates 1042 and 1044, OR gate 1048 and SRL 1038 are provided for subsequent registers such as register 1012, and so forth, as shown. The input to the next subsequent such identical circuit is provided from the output of an AND gate 1050 having as inputs the pass/fail signal, the output of SRL 1038, and the outputs of a series of OR gates 1052, 1054, and so forth. These OR gates 1052, 1054, and so forth operate in conjunction with the exclusive OR gates 1026, 1028, 1030, and so forth, mentioned above to prevent the capture of an address already captured in register 1010. Thus, an address appearing at the outputs of register 1002 is exclusive ORed with the outputs of register 1010. If identical addresses are in these two registers, then the output of OR gates 1052, 1054 and so forth, is a "0". This disables AND gate 1050, and effectively blocks the capture of that address in subsequent registers. Conversely, if a non-identical address is in register 1010, then AND gate 1050 is enabled, permitting subsequent registers to capture further failed addresses.

In this way, the addresses of numerous failed locations in the array 10 (FIG. 1), may be captured and utilized for further analysis or operation.

It is apparent that, while the invention has been particularly shown and described with reference to preferred embodiments thereof, it will be understood by those skilled in the art that various changes in form and details may be made therein without departing from the spirit and scope of the invention. For example, application of the invention is not limited to memory arrays, but may be applied to advantage to functional logic as well. It is understood, therefore, that the scope of the invention is limited only by the scope of the following claims.

We claim:

1. A built-in (on-chip) self-tester for a VLSI circuit comprising:
   a data pattern generator, for generating predetermined deterministic data patterns for application to the data inputs of said circuit, wherein the data patterns are determined by way of codes applied to the self-tester.
   an address counter for generating addresses for application to the address inputs of said circuit in coordination with the generation of said data patterns;

means for activating said data pattern generator and said address counter;

means for comparing the results with expected data results and providing a pass/fail signal.

2. A built-in self-tester for a VLSI memory circuit comprising:

a programmable data pattern generator, for generating predetermined deterministic data patterns for application to the data inputs of said circuit, wherein the patterns are selectable by way of program codes;

a programmable address counter for generating addresses which are applied to address inputs of said circuit under test in coordination with the generation of said data patterns;

a programmable controller for generating control signals which are applied to said circuit under test in coordination with the generation of said data patterns and said address inputs; and means for controlling operation of said self-tester, including means for activating said data pattern generator, said address counter and said controller; and means for comparing the output of said circuit under test with expected results, wherein said data pattern generator, said address counter and said controller automatically generate expect data, and provide a pass/fail signal.

3. A built-in (on-chip) self-tester for a VLSI circuit, comprising:

a data pattern generator, for generating predetermined deterministic data patterns for application to the data inputs of said circuit, said circuit producing output data in response thereto;

an address counter for generating addresses for application to the address inputs of said circuit in coordination with the generation of said data patterns;

means for controlling operation of said self tester, including means for activating said data pattern generator and said address counter, wherein the operations of said self-tester are selectably controllable by way of codes applied to said self-tester; and means for comparing the output data generated as a result of activating said data pattern generator and said address counter with expected output data and providing a pass/fail signal.

4. A self-tester according to claim 1, wherein said data patterns are selectable by way of codes in a scan command applied to said VLSI circuit.

5. A self-tester according to claim 3, wherein said operations are selectable by way of codes in a scan command applied to said VLSI circuit.

6. A self-tester according to claim 1, further comprising a set of latches for storing the digital values of said codes.

7. A self-tester according to claim 3, further comprising a set of latches of storing the digital values of said codes.

8. A self-tester according to claim 3, wherein said VLSI circuit is a memory circuit, and further comprising means for selecting by way of said codes, ascending or descending address generation during said test.

9. A self tester according to claim 4, further comprising means for controlling said data pattern generator so as to effect, selectably by way of said codes, application of true or complement data to said memory circuit.

10. A self tester according to claim 3, wherein said VLSI circuit is a memory circuit, and further comprising means for selecting by way of said codes the read and write sequence during said test.

11. A self tester according to claim 3, wherein said VLSI circuit is a memory circuit, and wherein said address counter is controllable so as to generate, selectably by way of said codes, addresses in a ripple bit or a ripple word sequence.

12. A built-in self-tester for a VLSI memory array circuit, comprising:

a data pattern generator, for generating predetermined deterministic data patterns for application to the data inputs of said array;

means for reading data to and writing data from said array;

an address counter for generating addresses for application to the address inputs of said circuit in coordination with the generation of said data patterns;

means for controlling operation of said self tester, including means for activating said data pattern generator and said address counter, wherein the operations of said self-tester, including read/write sequence on a per address basis through the array, the data pattern through the array, and the addressing sequence through the array, are all selectably controllable by way of codes applied to said self-tester; and means for comparing the data written from said array with expected data and providing a pass/fail signal.

13. A built-in (on chip) self-tester for a memory circuit comprising:

a programmable data pattern generator, for generating "0" or "1" data types in selectable, repetitive sequences wherein the data patterns are determined by way of program codes applied thereto;

a programmable address counter for generating addresses, wherein the maximum address space and least significant or, alternatively, most significant address partitions are selectable by way of a program code in coordination with generation of said patterns;

a programmable controller for generating read/write commands via predetermined repetitive sequences wherein the read/write commands are determined by way of program codes applied thereto in coordination with generation of said data patterns and said address inputs;

means for controlling operation of said self-tester, including means for activating said data pattern generator, said address counter and said controller; and means for comparing the data written to said array with expected data and providing a pass/fail signal.

14. A built-in (on-chip) self-tester for a memory circuit array comprising:

a programmable data pattern generator, for generating data patterns of "0" or "1" data types in predetermined repetitive sequences wherein said data patterns are determined by way of program codes applied thereto;

array control means for controlling said array to perform write and read operations;

means for controlling operation of said self-tester, including means for activating said data pattern generator and said array control means; and means for comparing the data written to said array with expected data and providing a pass/fail signal.

15. A built-in (on-chip) self-tester for a memory circuit comprising:
- a programmable address counter for generating addresses wherein the maximum address space and least significant or, alternatively, most significant address partitions are determined by way of program codes applied thereto; and
- means for controlling operation of said self-tester, including means for activating said address counter, wherein the operations of said self-tester, including address sequences applied to the array, are determined by way of program codes applied to said self-tester.

16. A built-in (on-chip) self-tester for a memory circuit comprising:
- a data pattern generator for generating data patterns for application to said memory circuit during a test operation;
- an address generator for generating address for application to said memory circuit during a test operation;
- a programmable controller for generating, in coordination with the generation of said data patterns and said addresses, read/write commands in predetermined repetitive sequences wherein the read/write commands are determined by way of program codes applied thereto; and
- means for controlling operation of said self-tester, including means for activating said controller.

* * * * *